United States Patent
Tsai et al.

(10) Patent No.: US 10,516,385 B2
(45) Date of Patent: Dec. 24, 2019

(54) RING OSCILLATOR, CONTROLLING CIRCUIT AND METHODS FOR REALIGNMENT

(71) Applicant: Taiwan Semiconductor Manufacturing Co., Ltd., Hsinchu (TW)

(72) Inventors: Tsung-Hsien Tsai, Taoyuan (TW); Ruey-Bin Sheen, Taichung (TW); Chih-Hsien Chang, New Taipei (TW); Cheng-Hsiang Hsieh, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 134 days.

(21) Appl. No.: 15/475,258

(22) Filed: Mar. 31, 2017

(65) Prior Publication Data
US 2018/0287593 A1 Oct. 4, 2018

(51) Int. Cl.
*H03K 3/03* (2006.01)
(52) U.S. Cl.
CPC .................. *H03K 3/0315* (2013.01)
(58) Field of Classification Search
CPC .......................... H03K 3/0315; H03K 3/0322
USPC .......................................................... 331/57
See application file for complete search history.

(56) References Cited

U.S. PATENT DOCUMENTS

| | | | | |
|---|---|---|---|---|
| 4,820,936 A * | 4/1989 | Veendrick | ............... | G05F 3/205 327/198 |
| 4,855,690 A * | 8/1989 | Dias | ........................ | G06F 7/588 331/78 |
| 5,264,808 A * | 11/1993 | Tanaka | ................. | H03K 3/0315 327/534 |
| 7,256,657 B2 * | 8/2007 | Sanchez | ................. | H03K 5/133 327/158 |
| 2005/0122178 A1 * | 6/2005 | Goto | ...................... | H03K 3/011 331/57 |
| 2007/0075792 A1 * | 4/2007 | Liu | ..................... | G01R 31/2856 331/57 |
| 2009/0189703 A1 * | 7/2009 | Chuang | ................. | H03K 3/0315 331/57 |

* cited by examiner

*Primary Examiner* — Levi Gannon
(74) *Attorney, Agent, or Firm* — McClure, Qualey & Rodack, LLP

(57) ABSTRACT

A ring oscillator is provided. The ring oscillator includes a pseudo pass-gate inverter, a third transistor, a fourth transistor and a delay chain. The pseudo pass-gate inverter includes a first transistor and a second transistor in series. The third transistor is connected in series with the pseudo pass-gate inverter. The drain of the fourth transistor is connected to an output of the pseudo pass-gate inverter. The gate of the fourth transistor is connected to the gate of the third transistor to receive the realignment signal. The delay chain includes a plurality of delay cells. An input of the delay chain is connected to the output of the pseudo pass-gate inverter. When the realignment signal is in a realignment state, the third transistor is turned off, the fourth transistor is turned on.

20 Claims, 9 Drawing Sheets

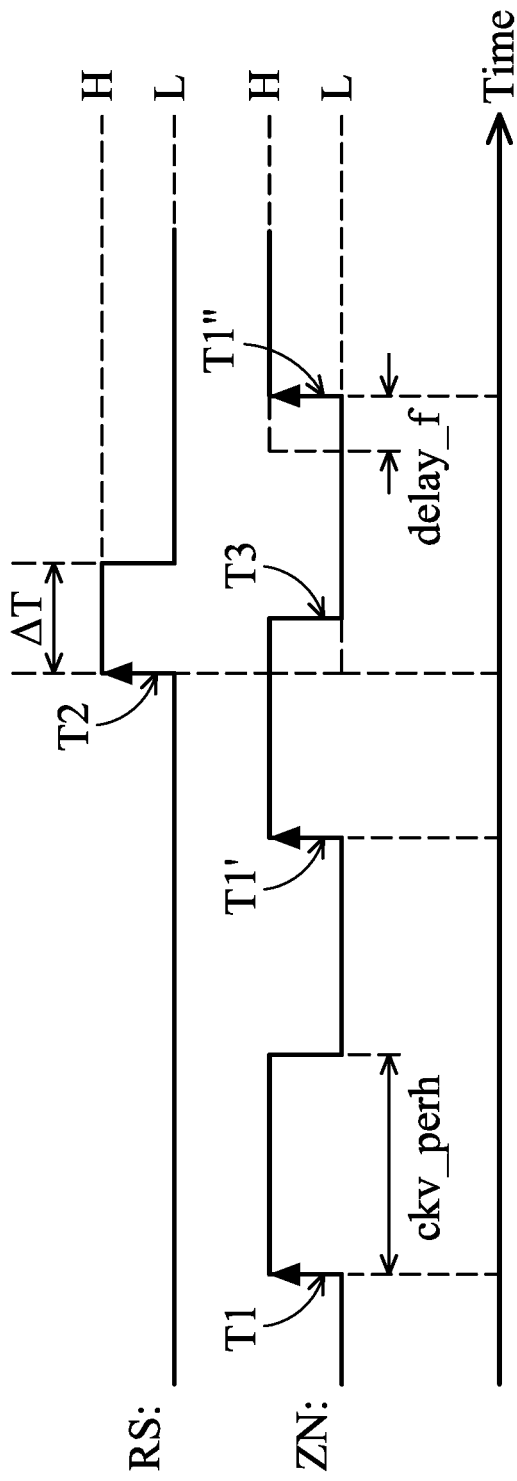
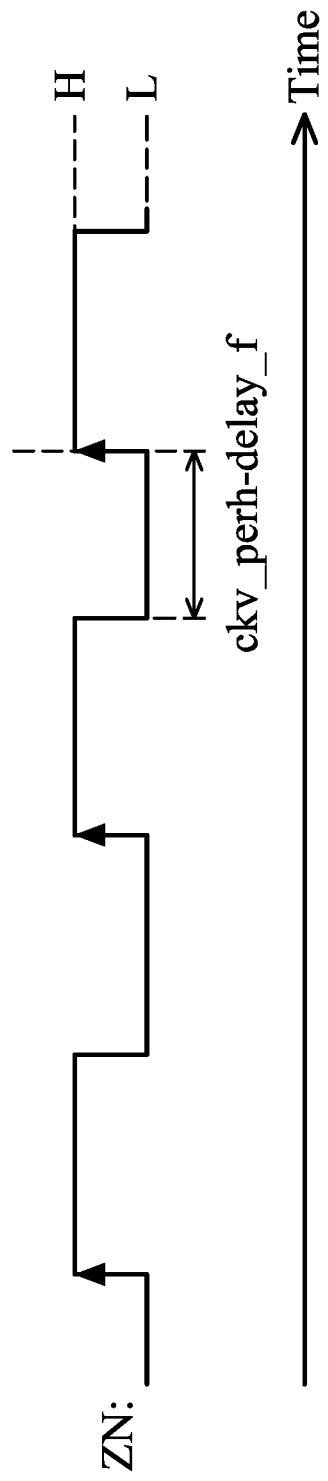
FIG. 5A
FIG. 5B

RING OSCILLATOR, CONTROLLING CIRCUIT AND METHODS FOR REALIGNMENT

BACKGROUND

Generally, an integrated circuit ("IC") is a circuit in which all or some of the circuit elements are inseparably associated and electrically interconnected so that it is considered to be indivisible. An IC is commonly embodied in a wafer. A wafer can be a slice or flat disk of semiconductor material or, for example, of semiconductor material deposited on a substrate, in which circuits or devices are simultaneously processed and, if there is more than one device, subsequently separated into dies. The wafer can have logic circuitry that forms a high-speed digital circuit, such as digital logic for a digital phase locked loop ("PLL") circuit, for example.

A ring oscillator is a component of the PLL circuit that facilitates clock generation in a wide range of application-specific integrated circuits (ASICs) including, but not limited to, network controllers, I/O controllers, graphics processors, or the like. As such, the DCO covers a wide frequency range for process, voltage, and temperature (PVT) variations, and also has a fine resolution. However, there is a need to improve the ring oscillator and the phase noise of the PLL.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 5A is a schematic diagram of the realignment signal and the waveform of the ring oscillator in the falling edge, in accordance with some embodiments.

FIG. 5B is a schematic diagram for adjusting the waveform of the ring oscillator in the falling edge, in accordance with some embodiments.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

Figure 1:
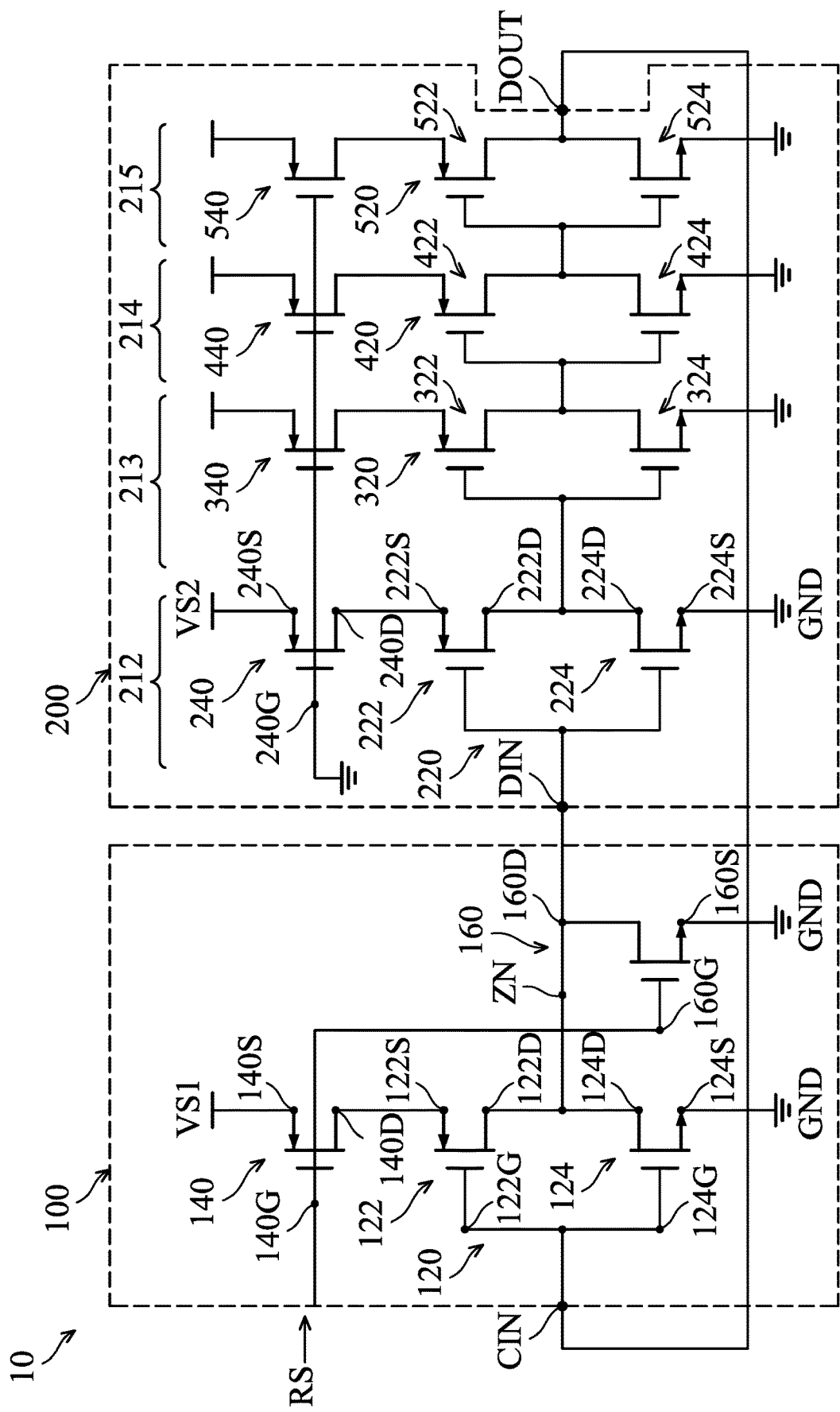
FIG. 1 is a schematic diagram of a ring oscillator, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in some various examples. This repetition is for the purpose of simplicity and clarity and does not in itself dictate a relationship between some various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device. Some of the features described below can be replaced or eliminated for different embodiments. Although some embodiments are discussed with operations performed in a particular order, these operations may be performed in another logical order.

FIG. 1 is a schematic diagram of a ring oscillator 10, in accordance with some embodiments. In some embodiments, the ring oscillator 10 includes a controlling circuit 100 and a delay chain 200. The controlling circuit 100 includes a pseudo pass-gate inverter 120, a P-type Metal-Oxide-Semiconductor (PMOS) transistor 140 and an N-type Metal-Oxide-Semiconductor (NMOS) transistor 160. The pseudo pass-gate inverter 120 includes a PMOS transistor 122 and an NMOS transistor 124.

In some embodiments, the realignment signal RS is received by the gate 140G of the PMOS transistor 140. The PMOS transistor 140 is connected in series with the pseudo pass-gate inverter 120 in order to enable or disable the pseudo pass-gate inverter 120. The source 140S of the PMOS transistor 140 is connected to a voltage source VS1. The drain 140D of the PMOS transistor 140 is connected to the pseudo pass-gate inverter 120 to control the pseudo pass-gate inverter 120.

The pseudo pass-gate inverter 120 includes a PMOS transistor 122 and an NMOS transistor 124. As shown in FIG. 1, the gate 122G of the PMOS transistor 122 and the gate 124G of the NMOS transistor 124 are connected to the node CIN. In addition, the source 122S of the PMOS transistor 122 is connected to the drain 140D of the PMOS transistor 140. The drain 122D of the PMOS transistor 122 is connected to the drain 124D of the NMOS transistor 124 at the node ZN. The source 124S of the NMOS transistor 124 is connected to the ground.

In some embodiments, the gate 160G of the NMOS transistor 160 is connected to the gate 140G. Therefore, the NMOS transistor 160 could also be controlled by the realignment signal RS. The drain 160D of the NMOS transistor 160 is connected to the node ZN, and the source 160S of the NMOS transistor 160 is connected to the ground.

In some embodiments, the delay chain 200 includes a plurality of delay cells 212~215. As shown in FIG. 1, four delay cells 212~215 are included in the delay chain 200. Each of the delay cells 212~215 includes a dummy PMOS transistor and an inverter. The delay cell 212 is the first tier since it is connected to the input node DIN of the delay chain 200, and the delay cell 215 is the last tier since it is connected to the output node DOUT of the delay chain 200. The input node DIN is connected to the node ZN. In other words, the input of the delay chain 200 is connected to the output of the controlling circuit 100.

In addition, regarding the delay chain 200, the delay cell 212 includes a dummy PMOS transistor 240 and an inverter 220. The delay cell 213 includes a dummy PMOS transistor 340 and an inverter 320. The delay cell 214 includes a dummy PMOS transistor 440 and an inverter 420. The delay cell 215 includes a dummy PMOS transistor 540 and an inverter 520.

In some embodiments, the ground 240G of the dummy PMOS transistor 240 is connected to the ground for turning on the dummy PMOS transistor 240. The source 240S of the dummy PMOS transistor 240 is connected to the voltage source VS2. The drain 240D of the dummy PMOS transistor 240 is connected to the inverter 220. It should be noted that the voltage source VS2 could be different from the voltage source VS1. In other embodiments, the voltage source VS2 is the same as the voltage source VS1.

In some embodiments, the inverter 220 includes the PMOS transistor 222 and the NMOS transistor 224. The gates of the PMOS transistor 222 and the NMOS transistor 224 are connected to the input node DIN. The source 222S of the PMOS transistor 222 is connected to the drain 240D of the dummy PMOS transistor 240. The drain 222D of the PMOS transistor 222 is connected to the drain 224D of the NMOS transistor 224. Furthermore, the source 224S of the NMOS transistor 224 is connected to the ground.

It should be noted that each of the gates of the dummy PMOS transistors 240, 340, 440 and 540 are connected together to the ground. As such, the four dummy PMOS transistors 240, 340, 440 and 540 are turned on. In addition, the gates of the PMOS transistor 322 and the NMOS transistor 324 of the inverter 320 are connected to the drains 222D and 224D of the inverter 220. The arrangements of the delay cells 213~215 is the same as the delay cell 212, and will not be repeated again.

Regarding the delay cell 215 (the last tier of the delay chain 200), the drains of the PMOS transistor 522 and the NMOS transistor 524 are connected to the output node DOUT of the delay chain 200. The output node DOUT of the delay chain 200 is connected to the node CIN of the controlling circuit 100 to form a closed loop.

In some embodiments, each of the dummy PMOS transistors 240~540 is identical to the PMOS transistor 140. Specifically, the size, the material and the manufacturing process for forming the PMOS transistor 140 is the same as those for forming the dummy PMOS transistors 240~540. In some embodiments, each of the inverters 220~520 is identical to the pseudo pass-gate inverter 120. Specifically, the size, the material and the manufacturing process for forming the pseudo pass-gate inverter 120 is the same as those for forming the inverters 220~520.

Figure 2A:
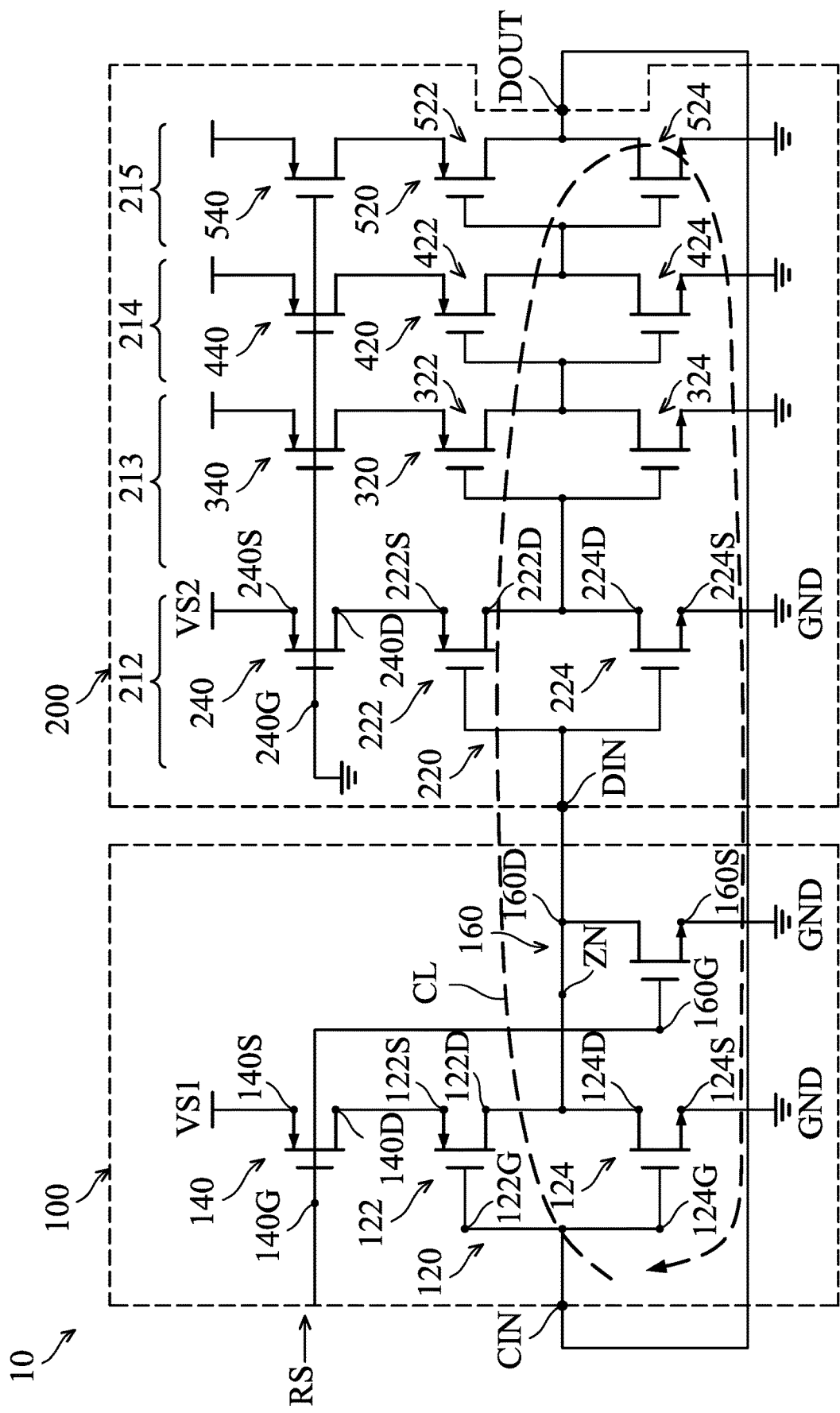
FIG. 2A is a schematic diagram of a ring oscillator when the realignment signal is in the normal state in accordance with some embodiments.

FIG. 2A is a schematic diagram of a ring oscillator 10 when the realignment signal RS is in the normal state in accordance with some embodiments. The realignment signal RS could be a square waveform or a clock signal. In some embodiments, the realignment signal RS includes a normal state and a realignment state which are repeated periodically. The realignment signal RS is at a first logic level when it is in the realignment state, and the realignment signal RS is at a second logic level when it is in the normal state. In other words, the voltage level of the realignment signal RS in the normal state is opposite to the voltage level of the realignment signal RS in the realignment state. In the embodiments of the FIG. 2A, the first logic level is high level, and the second logic level is low level.

As shown in FIG. 2A, when the realignment signal RS is in a normal state, low level of the realignment signal RS is provided to the gates of the PMOS transistor 140 and NMOS transistor 160. Afterwards, the PMOS transistor 140 is turned on and the NMOS transistor 160 is turned off due to the low level at the gates 140G and 160G. Because the PMOS transistor 140 is turned on, the pseudo pass-gate inverter 120 will be enabled and turned on, and signals could pass through the pseudo pass-gate inverter 120 and the delay chain 200.

More specifically, since the pseudo pass-gate inverter 120 is enabled, the closed loop CL could be formed accordingly associated with the delay chain 200. Therefore, the oscillated waveform could be generated due to the intrinsic device noise, the power noise and the temperature vibration of the ring oscillator 10. The oscillated waveform could be observed at the node ZN of the ring oscillator 10. In some embodiments, the waveform at the node ZN could be a square wave which includes a high level and a low level. The high level and the low level of the waveform of the node ZN could be repeated periodically.

Figure 2B:
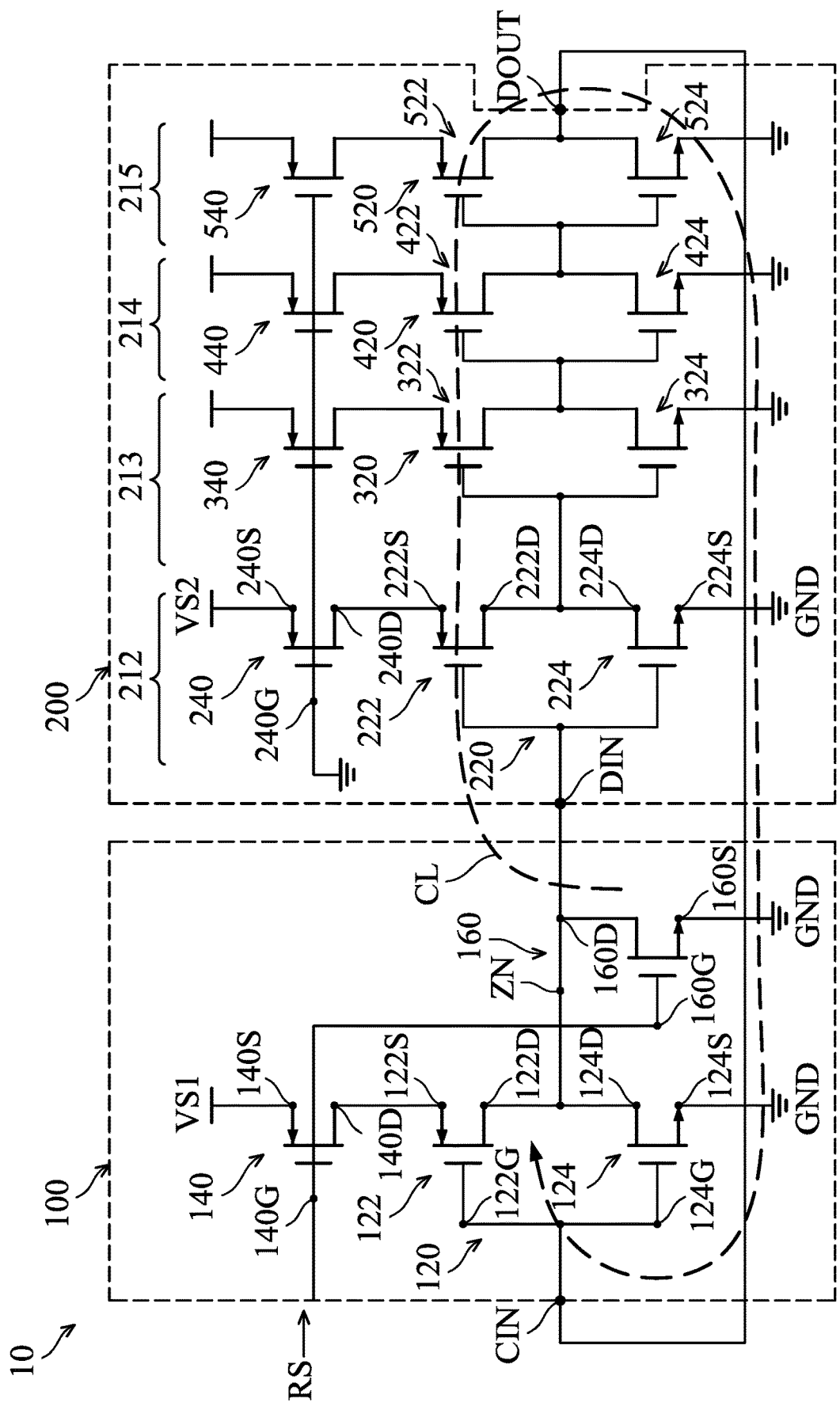
FIG. 2B is a schematic diagram of a ring oscillator when the realignment signal is in the realignment state in accordance with some embodiments.

FIG. 2B is a schematic diagram of a ring oscillator 10 when the realignment signal RS is in the realignment state in accordance with some embodiments. When the realignment signal RS is in the realignment state, high level of the realignment signal RS is provided to the gates of the PMOS transistor 140 and NMOS transistor 160. Afterwards, the PMOS transistor 140 is turned off and the NMOS transistor 160 is turned on due to the high level at the gates 140G and 160G. Because the PMOS transistor 140 is turned off, the pseudo pass-gate inverter 120 will be disabled and turned off, and signals will not pass through the pseudo pass-gate inverter 120 and the delay chain 200. Therefore, the closed loop CL is interrupted and broken in the realignment state.

In some embodiments, the NMOS transistor 160 is turned on when the realignment signal RS is high level. Therefore, the waveform at the node ZN (which is also connected to the drain of the NMOS transistor 160) is pulled-down from a high level to a low level in order to align the phase of the waveform of the ring oscillator 10. Specifically, the voltage at the node ZN is reduced to the level of the ground.

Afterwards, the low level or the ground level of the node ZN is transmitted to the inverters 220~520 of the delay chain 200, and the phase of the ring oscillator 10 could be updated and aligned. The phase vibration caused by the intrinsic device noise, the power noise and the temperature vibration of the ring oscillator 10 will be reset in the realignment state. Therefore, the waveform at the node ZN of the ring oscillator 10 will be adjusted and realigned.

By utilizing the ring oscillator 10 of the present disclosure, the phase of the waveform could be adjusted and realigned without adding an extra electronic component such as a multiplexer. Therefore, there is no additional phase delay or power consumption caused by the added electronic component. In addition, the transistors of the controlling circuit 100 are identical to the transistors of the delay chain 200. As a result, the manufacturing of the ring oscillator 10 could be easily integrated in a chip at a low cost.

Figure 3:
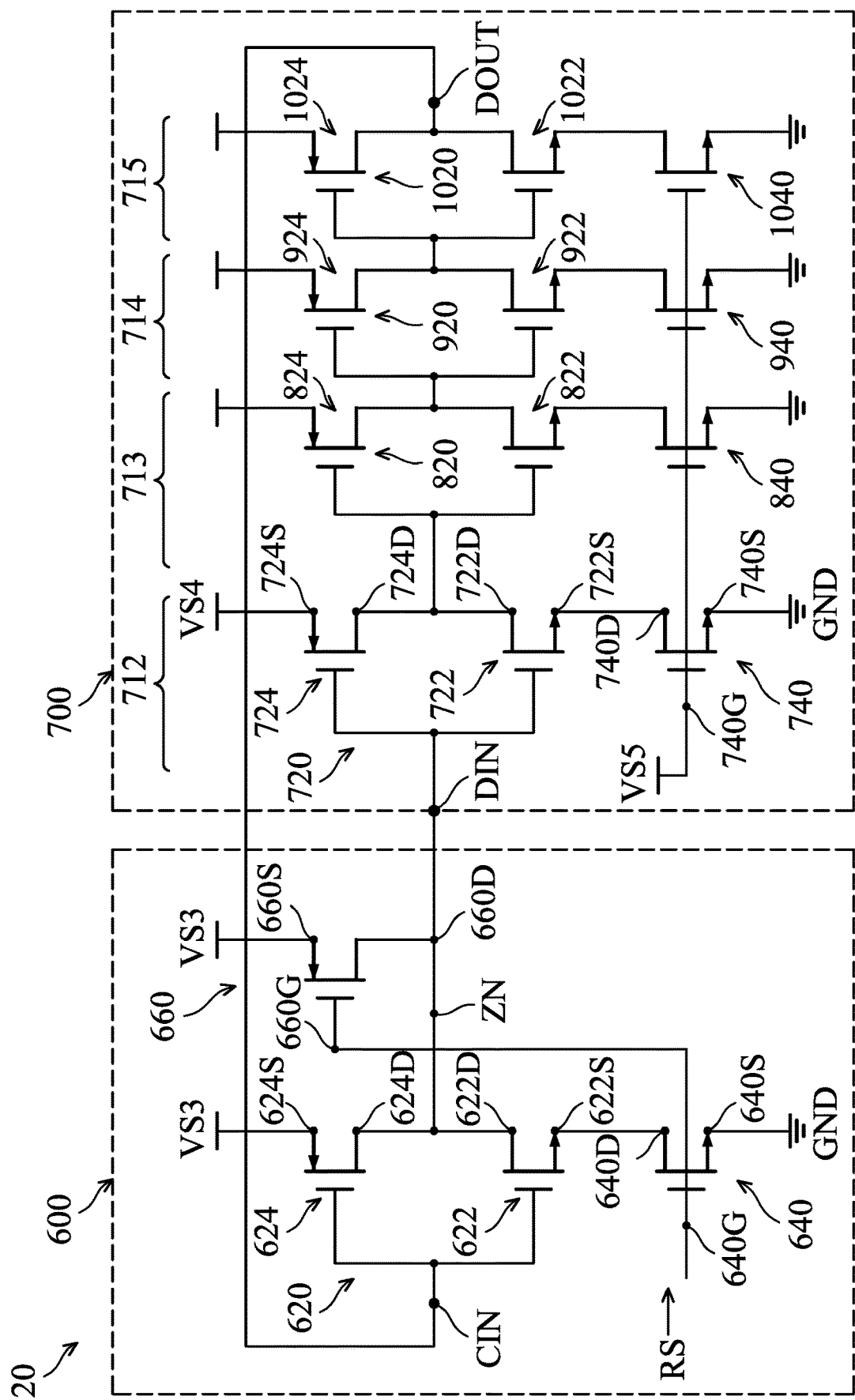
FIG. 3 is another schematic diagram of a ring oscillator, in accordance with some embodiments.

FIG. 3 is another schematic diagram of a ring oscillator 20, in accordance with some embodiments. In some embodiments, the ring oscillator 20 includes a controlling circuit 600 and a delay chain 700. The controlling circuit 600 includes a pseudo pass-gate inverter 620, an NMOS transistor 640 and a PMOS transistor 660. The pseudo pass-gate inverter 620 includes an NMOS transistor 622 and a PMOS transistor 624.

In some embodiments, the realignment signal RS is received by the gate 640G of the NMOS transistor 640. The NMOS transistor 640 is connected in series with the pseudo pass-gate inverter 620 in order to enable or disable the pseudo pass-gate inverter 620. The source 640S of the PMOS transistor 140 is connected to the ground. The drain 640D of the NMOS transistor 640 is connected to the pseudo pass-gate inverter 620 to control the pseudo pass-gate inverter 620.

The pseudo pass-gate inverter 620 includes an NMOS transistor 622 and a PMOS transistor 624. As shown in FIG. 3, the gate of the NMOS transistor 622 and the gate of the PMOS transistor 624 are connected to the node CIN. In addition, the source 622S of the NMOS transistor 622 is connected to the drain 640D of the NMOS transistor 640. The drain 622D of the NMOS transistor 622 is connected to the drain 624D of the PMOS transistor 624 at the node ZN. The source 624S of the PMOS transistor 624 is connected to the voltage source VS3.

In some embodiments, the gate 660G of the PMOS transistor 660 is connected to the gate 640G. Therefore, the PMOS transistor 660 could also be controlled by the realignment signal RS. The drain 660D of the PMOS transistor 660 is connected to the node ZN, and the source 660S of the PMOS transistor 660 is connected to the voltage source VS3.

In some embodiments, the delay chain 700 includes a plurality of delay cells 712~715. As shown in FIG. 3, four delay cells 712~715 are included in the delay chain 700. Each of the delay cells 712~715 includes a dummy NMOS transistor and an inverter. The delay cell 712 is the first tier since it is connected to the input node DIN of the delay chain 700, and the delay cell 715 is the last tier since it is connected to the output node DOUT of the delay chain 700. The input node DIN is connected to the node ZN. In other words, the input of the delay chain 700 is connected to the output of the controlling circuit 600.

In addition, regarding the delay chain 700, the delay cell 712 includes a dummy NMOS transistor 740 and an inverter 720. The delay cell 713 includes a dummy NMOS transistor 840 and an inverter 820. The delay cell 714 includes a dummy NMOS transistor 940 and an inverter 920. The delay cell 715 includes a dummy NMOS transistor 1040 and an inverter 1020.

In some embodiments, the ground 740G of the dummy NMOS transistor 740 is connected to the voltage source VS5 for turning on the dummy NMOS transistor 740. The source 740S of the dummy NMOS transistor 740 is connected to the ground. The drain 740D of the dummy NMOS transistor 740 is connected to the inverter 720. It should be noted that the voltage source VS3 could be different from the voltage source VS4. In other embodiments, the voltage source VS3 is the same as the voltage source VS4.

In some embodiments, the inverter 720 includes the NMOS transistor 722 and the PMOS transistor 724. The gates of the NMOS transistor 722 and the PMOS transistor 724 are connected to the input node DIN. The source 722S of the NMOS transistor 722 is connected to the drain 740D of the NMOS transistor 740. The drain 722D of the NMOS transistor 722 is connected to the drain 724D of the PMOS transistor 724. Furthermore, the source 724S of the PMOS transistor 724 is connected to the voltage source VS4.

It should be noted that each of the gates of the dummy NMOS transistors 740, 840, 940 and 1040 are connected together to the voltage source VS5. As such, the four dummy NMOS transistors 740, 840, 940 and 1040 are turned on. In addition, the gates of the NMOS transistor 822 and the PMOS transistor 824 of the inverter 820 are connected to the drains 722D and 724D of the inverter 720. Regarding the delay cell 715 (the last tier of the delay chain 700), the drains of the NMOS transistor 1022 and the PMOS transistor 1024 are connected to the output node DOUT of the delay chain 700. The output node DOUT of the delay chain 700 is connected to the node CIN of the controlling circuit 600 to form a closed loop.

In some embodiments, each of the dummy NMOS transistors 740~1040 is identical to the NMOS transistor 640. Specifically, the size, the material and the manufacturing process for forming the NMOS transistor 640 is the same as those for forming the dummy NMOS transistors 740~1040. In some embodiments, each of the inverters 720~1020 is identical to the pseudo pass-gate inverter 620. Specifically, the size, the material and the manufacturing process for forming the pseudo pass-gate inverter 620 is the same as those for forming the inverters 720~1020.

In some embodiments, when the realignment signal RS is in a normal state, a second logic level of the realignment signal RS is provided to the gates of the NMOS transistor 640 and the PMOS transistor 660. Afterwards, the NMOS transistor 640 is turned on and the PMOS transistor 660 is turned off due to the second logic level at the gates 640G and 660G. Because the NMOS transistor 640 is turned on, the pseudo pass-gate inverter 620 will be enabled and turned on, and signals could pass through the pseudo pass-gate inverter 620 and the delay chain 700. In the embodiments of FIG. 3, the first logic level is low level, and the second logic level is high level.

More specifically, since the pseudo pass-gate inverter 620 is enabled, the closed loop CL could be formed accordingly associated with the delay chain 700. Therefore, the oscillated waveform could be generated due to the intrinsic device noise, the power noise and the temperature vibration of the ring oscillator 20. The oscillated waveform could be observed at the node ZN of the ring oscillator 20. In some embodiments, the waveform at the node ZN could be a square wave which includes a high level and a low level. The high level and the low level of the waveform of the node ZN could be repeated periodically.

In some embodiments, when the realignment signal RS is in the realignment state, low level of the realignment signal RS is provided to the gates of the NMOS transistor 640 and the PMOS transistor 660. Afterwards, the NMOS transistor 640 is turned off and the PMOS transistor 660 is turned on due to the low level at the gates 640G and 660G. Because the NMOS transistor 640 is turned off, the pseudo pass-gate inverter 620 will be disabled and turned off, and signals will pass through the pseudo pass-gate inverter 620 and the delay chain 700. Therefore, the closed loop CL is interrupted and broken in the realignment state.

In some embodiments, the PMOS transistor 660 is turned on when the realignment signal RS is low level. Therefore, the waveform at the node ZN (which is also connected to the drain of the PMOS transistor 660) is pulled-up from a low level to a high level in order to align the phase of the waveform of the ring oscillator 20. Specifically, the voltage at the node ZN is increased to the voltage level of the voltage source VS3.

Afterwards, the high level of the node ZN is transmitted to the inverters 720~1020 of the delay chain 700, and the phase of the ring oscillator 20 could be updated and aligned. The phase vibration caused by the intrinsic device noise, the power noise and the temperature vibration of the ring oscillator 20 will be reset in the realignment state. Therefore, the waveform at the node ZN of the ring oscillator 20 will be adjusted and realigned.

Figure 4A:
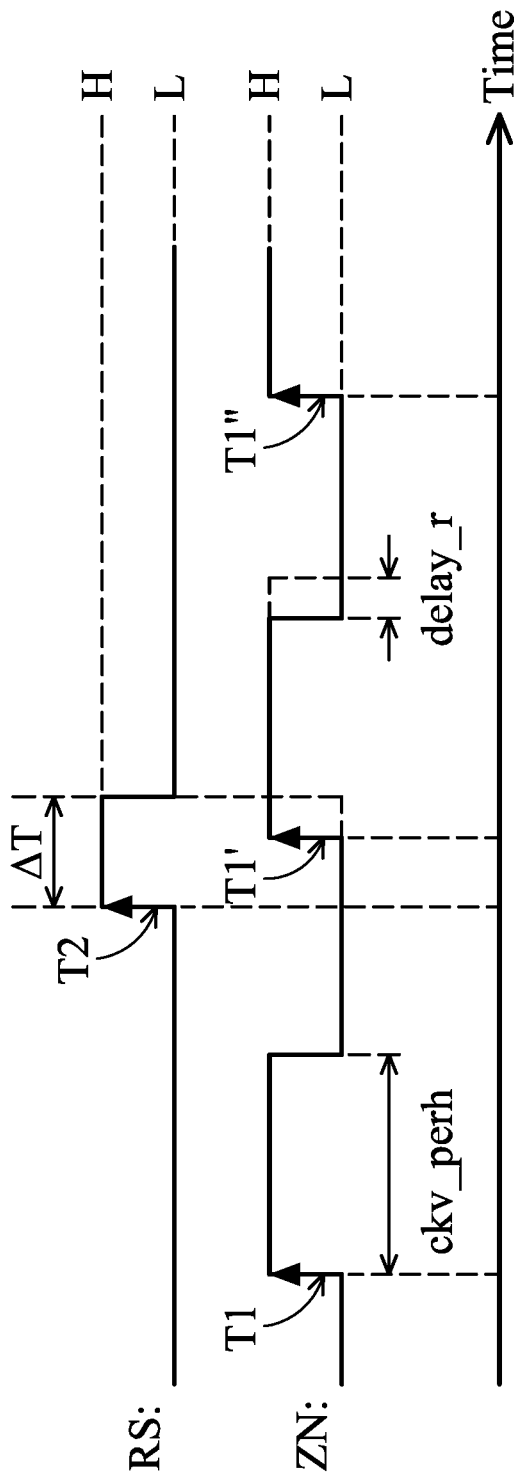
FIG. 4A is a schematic diagram of the realignment signal and the waveform of the ring oscillator in the rising edge, in accordance with some embodiments.

FIG. 4A is a schematic diagram of the realignment signal RS and the waveform of the ring oscillator 10 in the rising edge, in accordance with some embodiments. As shown in FIG. 4A, the realignment signal RS could be either high level (the realignment state) or low level (the normal state). The realignment signal RS switches from low level to high level at the time T2, and remains at a high level for a duration of ΔT, which is defined as the realignment gap ΔT.

In addition, the waveform at the node ZN of the ring oscillator 10 is also shown in FIG. 4A. The waveform at the node ZN is switched between high level and low level periodically. For example, at the time T1, T1' and T1" which are rising edges, the waveform at the node ZN is pulled-up from low level to high level. In some embodiments, a timing gap ΔG is defined by a timing difference between a time when the realignment signal RS switches from the normal state to the realignment state and another time when the waveform is pulled-up from the low level to the high level.

$$\Delta G = T2 - T1 \quad (1)$$

In some embodiments, a rising indicator is determined by subtracting the timing gap ΔG from a period of the waveform. Furthermore, the rising adjusting parameter delay_r is determined by subtracting the rising indicator from the realignment gap ΔT when the rising indicator is greater than zero, and the rising adjusting parameter is utilized to extend a half period with the high level of the waveform which is overlapped with the realignment gap ΔT.

$$ckv\_perh = \text{half period of the waveform} \quad (2)$$

$$delay\_r = \Delta T - (ckv\_perh * 2 - \Delta G) \quad (3)$$

Figure 4B:
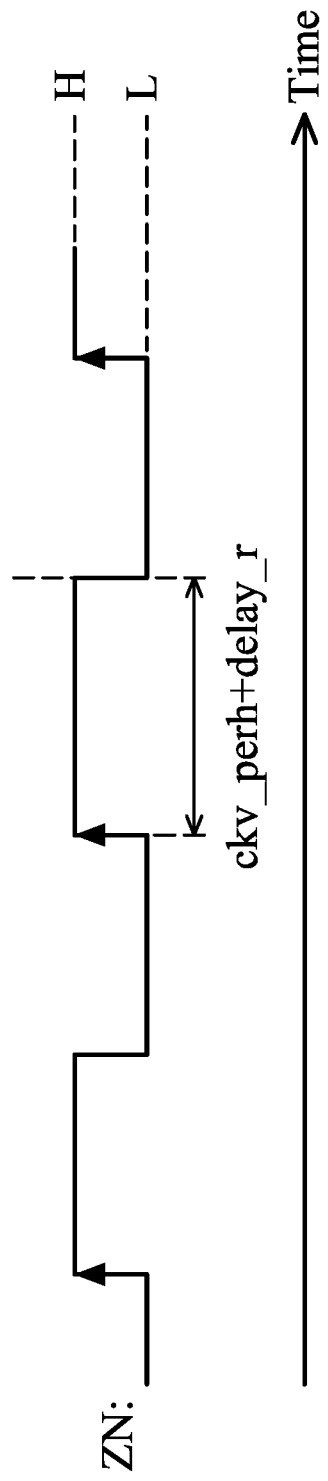
FIG. 4B is a schematic diagram for adjusting the waveform of the ring oscillator in the rising edge, in accordance with some embodiments.

FIG. 4B is a schematic diagram for adjusting the waveform of the ring oscillator 10 in the rising edge, in accordance with some embodiments. The rising adjusting parameter delay_r is utilized to extend a half period with the high level of the waveform which is overlapped with the realignment gap ΔT. As shown in FIG. 4B, the period with the high level has been extended to be the summation of ckv_perh and delay_r.

In some embodiments, the rising adjusting parameter delay_r is utilized to extend a half period with the high level of the waveform which is overlapped with the realignment gap ΔT when each of the timing gap ΔG, the rising indicator and the rising adjusting parameter delay_r is greater than zero.

FIG. 5A is a schematic diagram of the realignment signal RS and the waveform of the ring oscillator 10 in the falling edge, in accordance with some embodiments. At the rising edges T1, T1' and T1', the waveform at the node ZN is pulled-up from low level to high level. At the falling edge, the waveform at the node ZN is pulled-down from high level to low level.

In some embodiments, a falling adjusting parameter delay_f is determined by subtracting the timing gap ΔG from a period of the waveform when the timing gap ΔG is greater than zero. The falling adjusting parameter is utilized to reduce a half period with the low level of the waveform which is overlapped with the realignment gap ΔT.

$$delay\_f = ckv\_perh - \Delta G \quad (4)$$

FIG. 5B is a schematic diagram for adjusting the waveform of the ring oscillator in the falling edge, in accordance with some embodiments. The falling adjusting parameter is utilized to reduce a half period with the low level of the waveform which is overlapped with the realignment gap ΔT. As shown in FIG. 5B, the period with the low level has been reduced.

In some embodiments, the rising adjusting parameter delay_f is utilized to reduce a half period with the low level of the waveform which is overlapped with the realignment gap ΔT when each of the timing gap ΔG and the fall adjusting parameter delay_f is greater than zero.

In other embodiments, regarding the ring oscillator 20 as shown in FIG. 3, a timing gap ΔG is defined by a timing difference between a first time when the realignment signal RS switches from the normal state to the realignment state and a second time when the waveform is pulled-down from the high level to the low level. In addition, a realignment gap ΔT is determined to be a duration when a realignment signal RS is in the realignment state.

Furthermore, a rising indicator is determined by subtracting the timing gap ΔG from a period of the waveform, and a rising adjusting parameter is determined by subtracting the rising indicator from the realignment gap when the rising indicator is greater than zero. In some embodiments, the rising adjusting parameter delay_r is utilized to extend a half period with the low level of the waveform which is overlapped with the realignment gap.

In some embodiments, a falling adjusting parameter delay_f is determined by subtracting the timing gap from half period of the waveform when the timing gap is greater than zero, and the falling adjusting parameter is utilized to reduce the half period with the high level of the waveform which is overlapped with the realignment gap.

Figure 6:
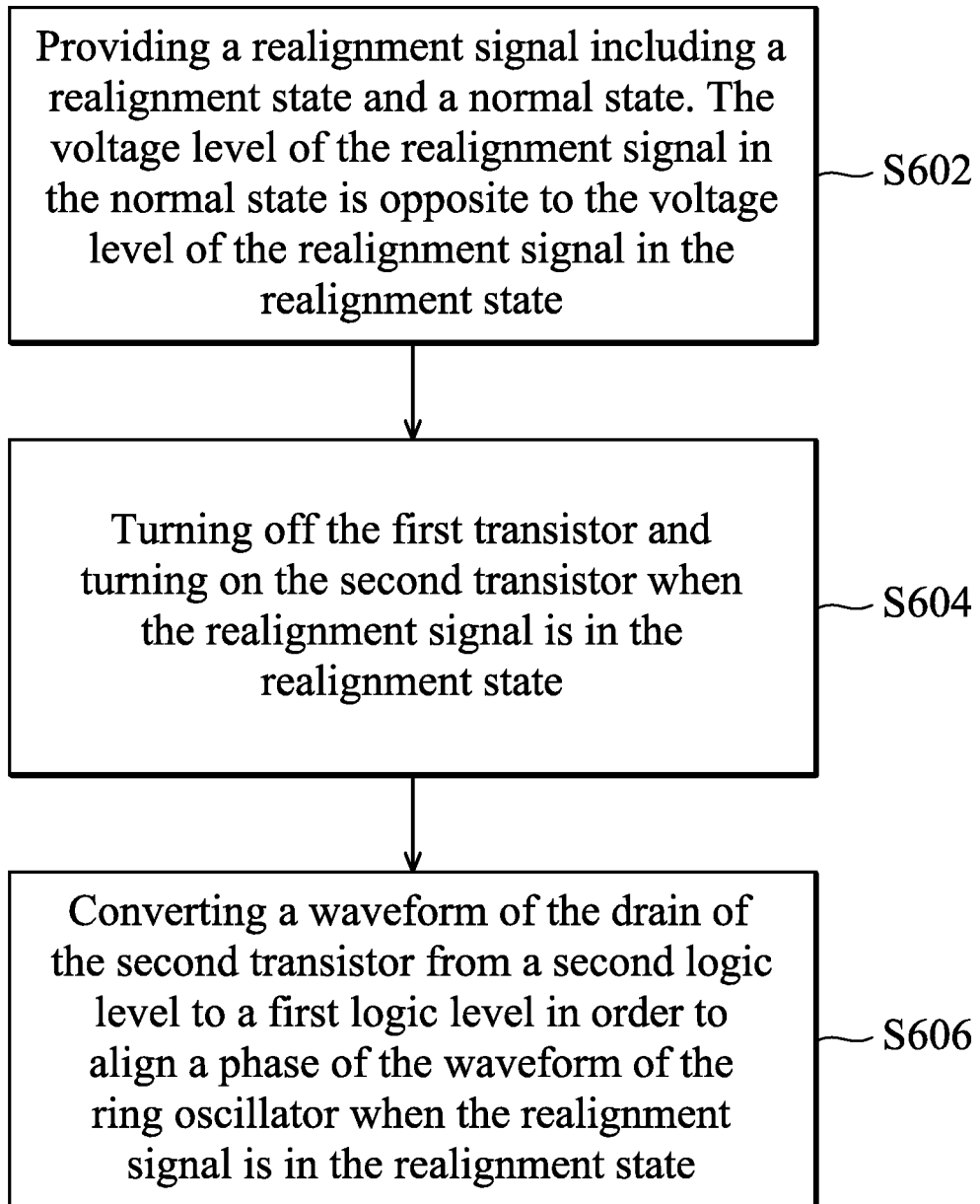
FIG. 6 is a flowchart for adjusting the waveform of the ring oscillator in the rising edge, in accordance with some embodiments.

FIG. 6 is a flowchart for adjusting the waveform of the ring oscillator in the rising edge, in accordance with some embodiments. In operation S602, a realignment signal is provided which includes a realignment state and a normal state. The voltage level of the realignment signal in the normal state is opposite to the voltage level of the realignment signal in the realignment state.

In operation S604, the first transistor is turned off and the second transistor is turned on when the realignment signal is in the realignment state. In operation S606, a waveform of the drain of the second transistor is converted from a second logic level to a first logic level in order to align a phase of the waveform of the ring oscillator when the realignment signal is in the realignment state.

Figure 7:
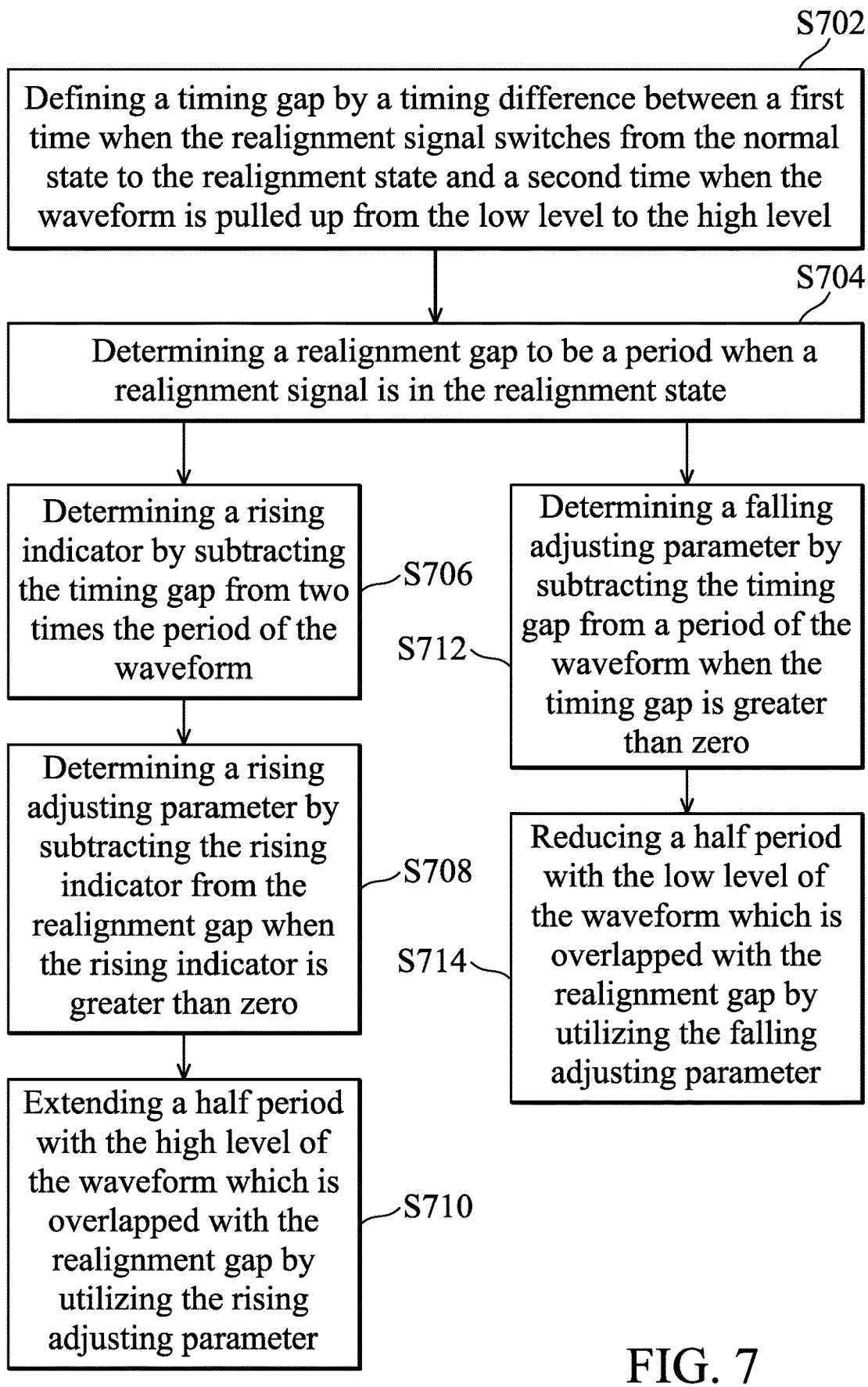
FIG. 7 is a flowchart of the realignment signal and the waveform of the ring oscillator, in accordance with the embodiments of FIG. 1.

FIG. 7 is a flowchart of the realignment signal and the waveform of the ring oscillator, in accordance with the embodiments of FIG. 1. In operation S702, a timing gap is defined by a timing difference between a first time when the realignment signal switches from the normal state to the realignment state and a second time when the waveform is pulled up from the low level to the high level. In operation S704, a realignment gap is determined to be a period when a realignment signal is in the realignment state.

In operation S706, a rising indicator is determined by subtracting the timing gap from two times the period of the waveform. In operation S708, a rising adjusting parameter is determined by subtracting the rising indicator from the realignment gap when the rising indicator is greater than zero. In operation S710, a half period with the high level of the waveform is extended which is overlapped with the realignment gap by utilizing the rising adjusting parameter.

In operation S712, a falling adjusting parameter is determined by subtracting the timing gap from a period of the waveform when the timing gap is greater than zero. In operation S714, a half period with the low level of the waveform is reduced which is overlapped with the realignment gap by utilizing the falling adjusting parameter.

Figure 8:
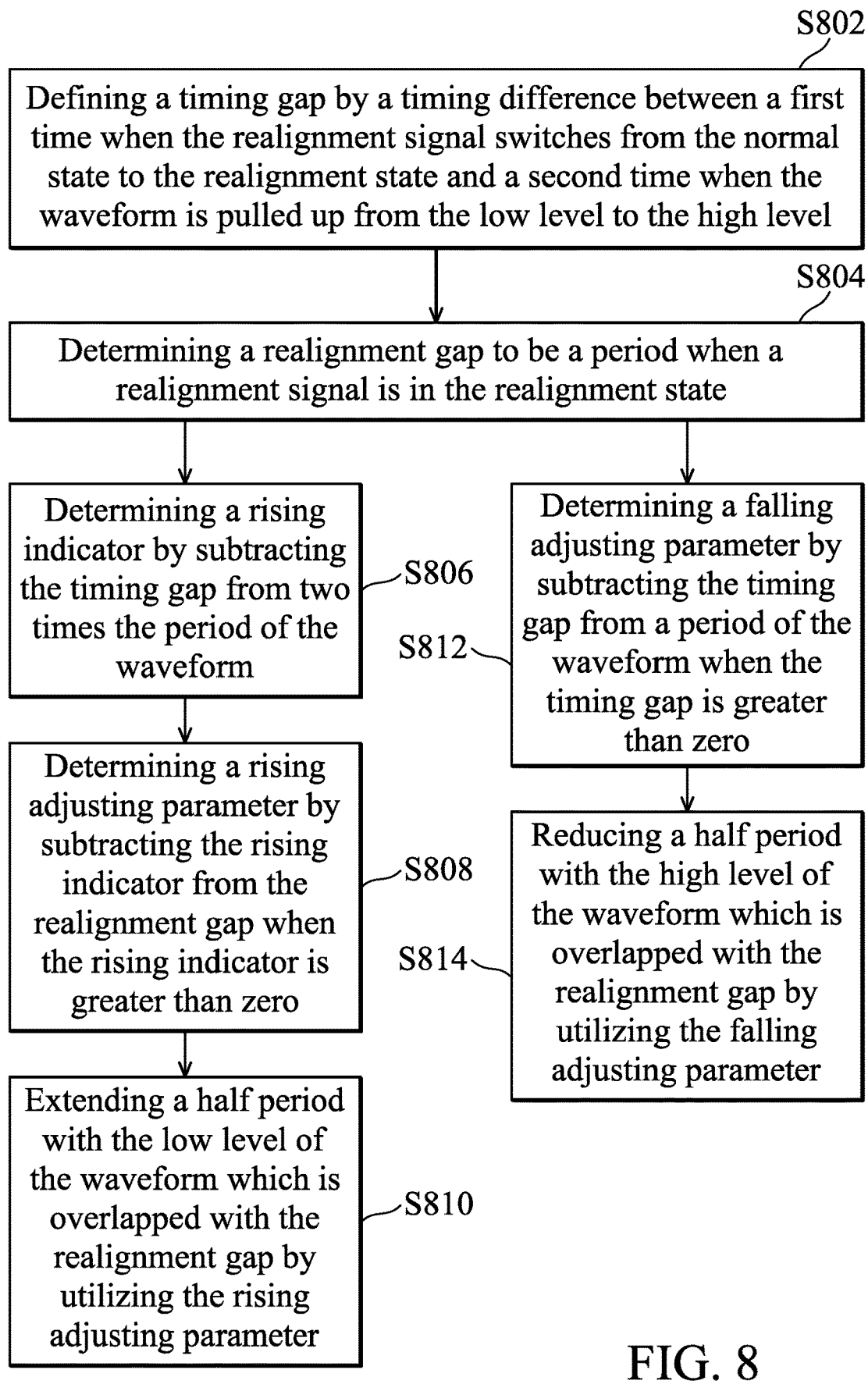
FIG. 8 is a flowchart of the realignment signal and the waveform of the ring oscillator, in accordance with the embodiments of FIG. 3.

FIG. 8 is a flowchart of the realignment signal and the waveform of the ring oscillator, in accordance with the embodiments of FIG. 3. In operation S802, a timing gap is defined by a timing difference between a first time when the realignment signal switches from the normal state to the realignment state and a second time when the waveform is pulled up from the low level to the high level. In operation S804, a realignment gap is determined to be a period when a realignment signal is in the realignment state.

Afterwards, in operation S806, a rising indicator is determined by subtracting the timing gap from two times the period of the waveform. In operation S808, a rising adjusting parameter is determined by subtracting the rising indicator from the realignment gap when the rising indicator is greater than zero. In operation S810, a half period with the low level of the waveform is extended which is overlapped with the realignment gap by utilizing the rising adjusting parameter.

In operation S812, a falling adjusting parameter is determined by subtracting the timing gap from a period of the waveform when the timing gap is greater than zero. In operation S814, a half period with the high level of the waveform is reduced which is overlapped with the realignment gap by utilizing the falling adjusting parameter.

By utilizing the ring oscillator 10 of the present disclosure, the phase of the waveform could be adjusted and realigned without adding an extra electronic component such as a multiplexer. Therefore, there is no additional phase delay or power consumption caused by the added electronic component. In addition, the transistors of the controlling circuit 100 are identical to the transistors of the delay chain 200. As a result, the manufacturing of the ring oscillator 10 could be easily integrated in a chip at a low cost.

In some embodiments, the operations and/or methods are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

In accordance with some embodiments, a ring oscillator is provided. The ring oscillator includes a pseudo pass-gate inverter, a third transistor, a fourth transistor and a delay chain. The pseudo pass-gate inverter includes a first transistor and a second transistor in series. Gates of the first transistor and the second transistor are connected. The third transistor is connected in series with the pseudo pass-gate inverter. A gate of the third transistor is utilized to receive a realignment signal. The drain of the fourth transistor is connected to an output of the pseudo pass-gate inverter. The gate of the fourth transistor is connected to the gate of the third transistor to receive the realignment signal. The delay chain includes a plurality of delay cells. An input of the delay chain is connected to the output of the pseudo pass-gate inverter. When the realignment signal is in a realignment state, the third transistor is turned off, the fourth transistor is turned on. The waveform of the drain of the fourth transistor is pulled down from a second logic level to a first logic level in order to align the phase of the waveform of the ring oscillator.

In accordance with some embodiments, a ring oscillator is provided. The ring oscillator includes a pseudo pass-gate inverter, a third transistor, and a fourth transistor. The pseudo pass-gate inverter includes a first transistor and a second transistor in series. Gates of the first transistor and the second transistor are connected. The third transistor is connected in series with the pseudo pass-gate inverter. Gate of the third transistor is utilized to receive a realignment signal. The drain of the fourth transistor is connected to an input of a delay chain and an output of the pseudo pass-gate inverter, a gate of the fourth transistor is connected to the gate of the third transistor to receive the realignment signal. When the realignment signal is in a realignment state, the third transistor is turned off, the fourth transistor is turned on. The waveform of the drain of the fourth transistor is pulled down from a second logic level to a first logic level in order to align the phase of the waveform of the ring oscillator.

In accordance with some embodiments, a method for realigning a ring oscillator is provided. The ring oscillator includes a pseudo pass-gate inverter, a first transistor, an second transistor and a delay chain. The method includes providing a realignment signal comprising a realignment state and a normal state. The voltage level of the realignment signal in the normal state is lower than the voltage level of the realignment signal in the realignment state. The method also includes turning off the first transistor and turning on the second transistor when the realignment signal is in the realignment state; and pulling down the waveform of the drain of the second transistor from a second logic level to a first logic level in order to align the phase of the waveform of the ring oscillator when the realignment signal is in the realignment state.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A controlling circuit for a ring oscillator, comprising:
   a pseudo pass-gate inverter, comprising a first transistor and a second transistor in series, wherein gates of the first transistor and the second transistor are connected;
   a third transistor, connected in series with the pseudo pass-gate inverter, wherein a gate of the third transistor is utilized to receive a realignment signal; and
   a fourth transistor, wherein a drain of the fourth transistor is connected to an input of a delay chain and an output of the pseudo pass-gate inverter, a gate of the fourth transistor is connected to the gate of the third transistor to receive the realignment signal, wherein the first and fourth transistors are of a first conductive type, and the second and third transistors are of a second conductive type, wherein the input of the delay chain is directly connected to a drain of the first transistor, a drain of the second transistor and the drain of the fourth transistor;
   wherein when the realignment signal is in a realignment state, the third transistor is turned off, the fourth transistor is turned on, and a waveform of the drain of the fourth transistor is pulled to a first logical level from a second logic level in order to align a phase of the waveform of the ring oscillator, a realignment gap is used to indicate a period when the realignment signal is in the realignment state, and a half period with the second logic level of the waveform is extended which is overlapped with the realignment gap.

2. The control circuit as claimed in claim 1, wherein the delay cells comprise respective inverters and respective dummy transistors, the respective inverters comprise respective fifth transistors and respective sixth transistors in series, and respective drains of the respective sixth transistors are connected to respective drains of the respective fifth transistors, and the input of the delay chain is connected to gates of first tier of the respective inverters, wherein the dummy transistors and the sixth transistors are of the second conductive type, and the fifth transistors are of the first conductive type.

3. The control circuit as claimed in claim 2, wherein respective gates of the respective dummy transistors are connected to a voltage source to turn on the respective dummy transistors.

4. The control circuit as claimed in claim 2, wherein an output of the delay chain is connected to drains of the fifth transistor and the sixth transistor of last tier of the respective inverters, and the output of the delay chain is connected to the input of the pseudo pass-gate inverter to form a closed loop, and the closed loop is interrupted when the pseudo pass-gate inverter is turned off.

5. The control circuit as claimed in claim 2, wherein when the realignment signal is in a normal state, the third transistor is turned on, the fourth transistor is turned off, and voltage level of the realignment signal in the normal state is opposite to the voltage level of the realignment signal in the realignment state.

6. A ring oscillator, comprising:
   a pseudo pass-gate inverter, comprising a first transistor and a second transistor in series, wherein gates of the first transistor and the second transistor are connected;
   a third transistor, connected in series with the pseudo pass-gate inverter, wherein a gate of the third transistor is utilized to receive a realignment signal;
   a fourth transistor, wherein a drain of the fourth transistor is connected to an output of the pseudo pass-gate inverter, a gate of the fourth transistor is connected to the gate of the third transistor to receive the realignment signal, wherein the first and fourth transistors are of a first conductive type, and the second and third transistors are of a second conductive type; and
   a delay chain, comprising a plurality of delay cells connected in series, wherein input of the delay chain is connected to the output of the pseudo pass-gate inverter, wherein the input of the delay chain is directly connected to a drain of the first transistor, a drain of the second transistor and the drain of the fourth transistor, wherein when the realignment signal is in a realignment state, the third transistor is turned off, the fourth transistor is turned on, and a waveform of the drain of the fourth transistor is pulled to a first logic level from a second logic level in order to align a phase of the waveform of the ring oscillator, the delay cells comprise respective inverters and respective dummy transistors, the respective inverters comprise respective fifth transistors and respective sixth transistors in series, wherein respective sources of the dummy transistors and respective sources of the respective fifth transistors of the respective inverters are directly connected to ground or a first voltage source,
   wherein a realignment gap is used to indicate a period when the realignment signal is in the realignment state, and a half period with the second logic level of the waveform is extended which is overlapped with the realignment gap.

7. The ring oscillator as claimed in claim 6, wherein respective drains of the respective sixth transistors are connected to respective drains of the respective fifth transistors, and the input of the delay chain is connected to gates of the first tier of the respective inverters, wherein the dummy transistors and the sixth transistors are of the second conductive type, and the fifth transistors are of the first conductive type.

8. The ring oscillator as claimed in claim 7, wherein the first conductive type is N-type, the second conducive type is P-type, and respective gates of the respective dummy transistors are connected to a second voltage source to turn on the respective dummy transistors.

9. The ring oscillator as claimed in claim 7, wherein the first conductive type is P-type, the second conducive type is N-type, and respective gates of the respective dummy transistors are connected to ground to turn on the respective dummy transistors.

10. The ring oscillator as claimed in claim 7, wherein an output of the delay chain is connected to drains of the fifth transistor and sixth transistor of the last tier of the respective inverters, and the output of the delay chain is connected to the input of the pseudo pass-gate inverter to form a closed loop, and the closed loop is interrupted when the pseudo pass-gate inverter is turned off.

11. The ring oscillator as claimed in claim 7, wherein when the realignment signal is in a normal state, the third transistor is turned on, the fourth transistor is turned off, and a voltage level of the realignment signal in the normal state is opposite to the voltage level of the realignment signal in the realignment state.

12. The ring oscillator as claimed in claim 6, wherein a half period with the first logic level of the waveform is reduced which is overlapped with the realignment gap.

13. The ring oscillator as claimed in claim 6, wherein the first logic level is complementary to the second logic level.

14. A method for realigning a ring oscillator which comprises a pseudo pass-gate inverter, a first transistor, a second transistor and a delay chain, the pseudo pass-gate inverter comprising a third transistor and a fourth transistor, the method comprising:

provided a realignment signal comprising a realignment state and a normal state, wherein the voltage level of the realignment signal in the normal state is opposite to the voltage level of the realignment signal in the realignment state;

turning off the first transistor and turning on the second transistor when the realignment signal is in the realignment state; and converting a waveform of a drain of the second transistor from a second logic level to a first logic level in order to align a phase of the waveform of the ring oscillator when the realignment signal is in the realignment state, wherein an input of the delay chain is directly connected to a drain of the third transistor, a drain of the fourth transistor and the drain of the second transistor;

determining a realignment gap to be a period when the realignment signal is in the realignment state; and reducing a half period with the first logic level of the waveform which is overlapped with the realignment gap.

15. The method for realigning a ring oscillator as claimed in claim 14, wherein the first transistor is P-type, the second transistor is N-type, the first logic level is a low level, the second logic level is a high level, the method further comprising:

defining a timing gap by a timing difference between a first time when the realignment signal switches from the normal state to the realignment state and a second time when the waveform is pulled up from the low level to the high level.

16. The method for realigning a ring oscillator as claimed in claim 15, further comprising:

determining a rising indicator by subtracting the timing gap from two times the period of the waveform;

determining a rising adjusting parameter by subtracting the rising indicator from the realignment gap when the rising indicator is greater than zero; and extending the half period with the high level of the waveform which is overlapped with the realignment gap by utilizing the rising adjusting parameter.

17. The method for realigning a ring oscillator as claimed in claim 15, further comprising:

determining a falling adjusting parameter by subtracting the timing gap from a period of the waveform when the timing gap is greater than zero; and reducing the half period with the low level of the waveform which is overlapped with the realignment gap by utilizing the falling adjusting parameter.

18. The method for realigning a ring oscillator as claimed in claim 14, wherein the first transistor is N-type, the second transistor is P-type, the first logic level is a high level, the second logic level is a low level, the method further comprising:

defining a timing gap by a timing difference between a first time when the realignment signal switches from the normal state to the realignment state and a second time when the waveform is pulled up from the low level to the high level.

19. The method for realigning a ring oscillator as claimed in claim 18, further comprising:

determining a rising indicator by subtracting the timing gap from two times the period of the waveform;

determining a rising adjusting parameter by subtracting the rising indicator from the realignment gap when the rising indicator is greater than zero; and extending the half period with the low level of the waveform which is overlapped with the realignment gap by utilizing the rising adjusting parameter.

20. The method for realigning a ring oscillator as claimed in claim 18, further comprising:

determining a falling adjusting parameter by subtracting the timing gap from a period of the waveform when the timing gap is greater than zero; and reducing the half period with the high level of the waveform which is overlapped with the realignment gap by utilizing the falling adjusting parameter.

* * * * *